(12) United States Patent
Guo et al.

(10) Patent No.: US 8,119,529 B2
(45) Date of Patent: Feb. 21, 2012

(54) METHOD FOR CHEMICAL MECHANICAL POLISHING A SUBSTRATE

(75) Inventors: Yi Guo, Newark, DE (US); Zhendong Liu, King of Prussia, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 367 days.

(21) Appl. No.: 12/432,021

(22) Filed: Apr. 29, 2009

(65) Prior Publication Data

US 2010/0279507 A1 Nov. 4, 2010

(51) Int. Cl.
*H01L 21/302* (2006.01)

(52) U.S. Cl. ........ 438/693; 252/79.1

(58) Field of Classification Search .......... 438/693
See application file for complete search history.

(56) References Cited

U.S. PATENT DOCUMENTS

| | | | |
|---|---|---|---|
| 3,551,168 A | 12/1970 | Altherton et al. | |
| 7,018,560 B2 | 3/2006 | Liu et al. | |
| 7,238,618 B2 * | 7/2007 | Mueller et al. | 438/689 |
| 7,252,782 B2 * | 8/2007 | Ikeda et al. | 252/79.1 |
| 2004/0060502 A1 * | 4/2004 | Singh | 117/68 |
| 2006/0276109 A1 * | 12/2006 | Roy et al. | 451/41 |
| 2007/0184661 A1 | 8/2007 | Bian et al. | |
| 2008/0121839 A1 * | 5/2008 | Park et al. | 252/79.1 |
| 2008/0203354 A1 * | 8/2008 | Kamimura et al. | 252/79.1 |
| 2008/0220610 A1 | 9/2008 | Bayer et al. | |

* cited by examiner

*Primary Examiner* — Binh X Tran
*Assistant Examiner* — David Cathey, Jr.
(74) *Attorney, Agent, or Firm* — Thomas S. Deibert

(57) ABSTRACT

A method for chemical mechanical polishing of a substrate, comprising: providing a substrate, wherein the substrate comprises silicon dioxide; providing a chemical mechanical polishing composition, wherein the chemical mechanical polishing composition comprises: water, an abrasive; a diquaternary cation according to formula (I); and optionally a quaternary alkylammonium compound; providing a chemical mechanical polishing pad; creating dynamic contact at an interface between the chemical mechanical polishing pad and the substrate; and dispensing the chemical mechanical polishing composition onto the chemical mechanical polishing pad at or near the interface between the chemical mechanical polishing pad and the substrate; wherein the chemical mechanical polishing composition has a pH of 2 to 6; wherein the chemical mechanical polishing composition exhibits a silicon dioxide removal rate of at least 1,500 Å/min.

14 Claims, No Drawings

METHOD FOR CHEMICAL MECHANICAL POLISHING A SUBSTRATE

The present invention relates generally to the field of chemical mechanical polishing. In particular, the present invention is directed to a method for chemical mechanical polishing of semiconductor materials and, more particularly to a method for chemical mechanical polishing processes for removing silicon oxide.

Chip fabricators use multiple chemical mechanical polishing steps to planarize wafers to facilitate the production of flat substrate surfaces. These flat surfaces facilitate the production of multi-level integrated circuits without the detrimental distortion experience from applying dielectric to uneven substrates.

The chemical mechanical polishing process is typically carried out in a two step sequent to improve polishing performance. First, the polishing process uses a "first-step" slurry specifically designed to rapidly remove the interconnect metal, such as copper. After this initial copper removal step, a "second-step" slurry removes the barrier layer. Typically, the second-step slurries have selectivity to remove the barrier layer without adversely impacting the physical structure or electrical properties of the interconnect structure by "dishing" the interconnect metal. The removal rate of the barrier versus the removal rate of the metal interconnect or the dielectric layer is known as the selectivity ratio. For purposes of this specification removal rate refers to a removal rate as change of thickness per unit time, such as, Angstroms per minute.

After removing the barrier layer, the slurry typically removes an underlying layer, such as a silicon oxide-containing material. For the purposes of this invention, silicon oxide-containing materials include materials derived from silanes such as tetratethylorthosilicate (TEOS) and other silicon oxide-containing coatings used to fabricate semiconductors other than SiCO or SiOC. Unfortunately, slurries that remove silicon oxide-containing materials at rapid removal rates tend to also remove underlying masks, caps, anti-reflective coatings and dielectrics, especially low k and ultra-low k dielectrics at unacceptable removal rates. The uncontrolled removal of these underlying layers can have a detrimental impact upon the integrated circuit's ultimate performance.

In several low k dielectric and ultra-low k integration schemes, depositing capping materials on top of the dielectrics protects the dielectrics from mechanical damage. Then above the capping layer a mask layer, such as TEOS, defines area for dielectric or interconnect metal within the integrated circuit by removing the mask layer with a patterned etch process. After etching, a barrier layer covers the substrate and then a metal layer, such as copper, fills the channels or vias. For efficacious CMP, these semiconductor integration schemes typically require the selective removal of mask layers, such as TEOS mask layers with low-level dishing of metal interconnects and minimal removal of a bottom capping layer. For some integrations schemes, however, it is advantageous to also remove the lower capping layer and stop on the low k dielectric.

Since silicon oxide-containing layers, such as TEOS, have higher dielectric constants than the low k and ultra-low k materials, it is advisable to keep these TEOS layers as thin as possible to maintain the wafer's low-effective dielectric constant. Because thicker TEOS layers improve process control for CMP integration, however, the ultimate thickness selected represents a compromise between these two competing functions. The "thick" TEOS layers resulting from this compromise require polishing composition with an efficient mask removal step with a controlled interconnect metal removal rate.

In summary, these semiconductor integration schemes require the selective removal of silicon oxide-containing layers with an effective removal rate and either stopping on the lower capping layer or on the dielectric. In view of these considerations, there is a desire to provide polishing compositions that permit controlled silicon oxide-containing layer removal. In addition, there is an ongoing desire to remove silicon oxide-containing layers, such as TEOS mask layers, with reduced defectivity.

In addition, since semiconductor fabricators rely upon different integration schemes and low k/ultra-low k materials, semiconductor customers have different requirements for the CMP slurries. These divergent integration schemes render formulating a universal polishing solution most difficult. Thus it is also efficacious to adjust the removal rate of silicon oxide-containing layers, cap layers, as well as the metal interconnect, such as copper to satisfy multiple integration schemes.

One polishing composition for removing silicon oxide is disclosed in U.S. Pat. No. 7,018,560 to Liu et al. Liu et al. discloses an aqueous polishing composition comprising: a corrosion inhibitor for limiting removal of an interconnect metal; an acidic pH; abrasive particles; and an organic-containing ammonium salt formed with

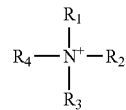

wherein $R_1$, $R_2$, $R_3$ and $R_4$ are radicals, $R_1$ is an unsubstituted aryl, alkyl, aralkyl, or alkaryl group that has a carbon chain length of 2 to 15 carbon atoms and the organic-containing ammonium salt has a concentration that accelerates silicon dioxide removal and decreases removal of at least one coating selected from the group consisting of SiC, SiCN, $Si_3N_4$ and SiCO with at least one polishing pressure less than 21.7 kPa.

There nevertheless remains a need for chemical mechanical polishing (CMP) compositions capable of selectively removing silicon oxide.

In one aspect of the present invention, there is provided a method for chemical mechanical polishing of a substrate, comprising: providing a substrate, wherein the substrate comprises silicon dioxide; providing a chemical mechanical polishing composition, wherein the chemical mechanical polishing composition comprises: water, 0.1 to 30 wt % abrasive having an average particle size of ≦100 nm; 0.005 to 0.5 wt % diquaternary cation according to formula (I):

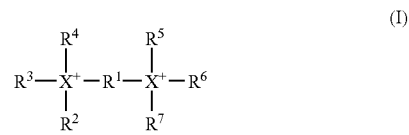

wherein each X is independently selected from N and P; wherein $R^1$ is a saturated or unsaturated, optionally substituted, aryl, alkyl, aralkyl, or alkaryl group having a carbon chain length of 1 to 15 carbon atoms; and, wherein $R^2$, $R^3$, $R^4$, $R^5$, $R^6$ and $R^7$ are each independently selected from a saturated or unsaturated, optionally substituted, aryl, alkyl, aralkyl or alkaryl group having a carbon chain length of 1 to 15 carbon atoms; and 0 to 0.1 wt % quaternary alkylammonium compound; providing a chemical mechanical polishing pad; creating dynamic contact at an interface between the chemical mechanical polishing pad and the substrate with a down force of 0.1 to 5 psi; and dispensing the chemical mechanical polishing composition onto the chemical mechanical polishing pad at or near the interface between the chemical mechanical polishing pad and the substrate; wherein the chemical mechanical polishing composition has a pH of 2 to 6; and, wherein the chemical mechanical polishing composition exhibits a silicon dioxide removal rate of at least 1,500 Å/min.

In another aspect of the present invention, there is provided a method for chemical mechanical polishing of a substrate, comprising: providing a substrate, wherein the substrate comprises silicon dioxide deposited on $Si_3N_4$; providing a chemical mechanical polishing composition, wherein the chemical mechanical polishing composition comprises: water, 1 to 5 wt % colloidal silica abrasive having an average particle size of 20 to 30 nm; 0.02 to 0.06 wt % diquaternary cation according to formula (I)

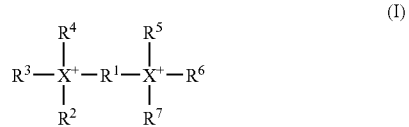

wherein each X is N; wherein $R^1$ is a $C_2$-$C_6$ alkyl group; and, wherein $R^2$, $R^3$, $R^4$, $R^5$, $R^6$ and $R^7$ are each independently selected from a $C_2$-$C_6$ alkyl group; 0.005 to 0.055 wt % quaternary alkylammonium compound selected from tetraethyl ammonium hydroxide and tetrabutyl ammonium hydroxide; providing a chemical mechanical polishing pad; creating dynamic contact at an interface between the chemical mechanical polishing pad and the substrate with a down force of 0.1 to 5 psi; and dispensing the chemical mechanical polishing composition onto the chemical mechanical polishing pad at or near the interface between the chemical mechanical polishing pad and the substrate; wherein the chemical mechanical polishing composition has a pH of 3 to 4; wherein the silicon dioxide and silicon nitride are exposed to the chemical mechanical polishing composition; wherein the chemical mechanical polishing composition exhibits a silicon dioxide removal rate of at least 1,500 Å/min; wherein the silicon dioxide and silicon nitride are exposed to the chemical mechanical polishing composition; and, wherein the chemical mechanical polishing composition exhibits a silicon dioxide to silicon nitride selectivity of at least 5 to 1.

In another aspect of the present invention there is provided a method for chemical mechanical polishing of a substrate, comprising: providing a substrate, wherein the substrate comprises silicon dioxide deposited on $Si_3N_4$; providing a chemical mechanical polishing composition, wherein the chemical mechanical polishing composition comprises: water, 1 to 5 wt % colloidal silica abrasive having an average particle size of 20 to 30 nm; 0.02 to 0.06 wt % diquaternary cation according to formula (I)

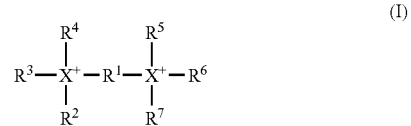

wherein each X is N; wherein $R^1$ is a —$(CH_2)_6$— group; and, wherein $R^2$, $R^3$, $R^4$, $R^5$, $R^6$ and $R^7$ are each a —$(CH_2)_3CH_3$ group; 0.005 to 0.055 wt % quaternary alkylammonium compound selected from tetraethyl ammonium hydroxide and tetrabutyl ammonium hydroxide; providing a chemical mechanical polishing pad; creating dynamic contact at an interface between the chemical mechanical polishing pad and the substrate with a down force of 0.1 to 5 psi; and dispensing the chemical mechanical polishing composition onto the chemical mechanical polishing pad at or near the interface between the chemical mechanical polishing pad and the substrate; wherein the chemical mechanical polishing composition has a pH of 3 to 4; wherein the silicon dioxide and silicon nitride are exposed to the chemical mechanical polishing composition; wherein the chemical mechanical polishing composition exhibits a silicon dioxide removal rate of at least 2,000 Å/min with a platen speed of 93 revolutions per minute, a carrier speed of 87 revolutions per minute, a chemical mechanical polishing composition flow rate of 200 ml/min, and a nominal down force of 3 psi on a 200 mm polishing machine where the chemical mechanical polishing pad comprises a polyurethane polishing layer containing polymeric hollow core microparticles and a polyurethane impregnated non-woven subpad; wherein the silicon dioxide and silicon nitride are exposed to the chemical mechanical polishing composition; wherein the chemical mechanical polishing composition exhibits a silicon dioxide to $Si_3N_4$ selectivity of at least 5 to 1.

DETAILED DESCRIPTION

Selection of the specific formulation of the chemical mechanical polishing composition used in the chemical mechanical polishing method of the present invention is key to providing target silicon dioxide removal rates.

Substrate suitable for use in the chemical mechanical polishing method of the present invention for chemical mechanical polishing comprises a semiconductor substrate having silicon dioxide deposited thereon. Preferably, the substrate has silicon dioxide deposited over at least one of SiC, SiCN, $Si_3N_4$, SiCO and polysilicon. Most preferably, the substrate has silicon dioxide deposited over $Si_3N_4$.

Abrasives suitable for use in the chemical mechanical polishing compositions used in the chemical mechanical polishing method of the present invention include, for example, inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Modified forms of these inorganic oxides, such as, organic polymer-coated inorganic oxide particles and inorganic coated particles can also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Preferably, the abrasive is a colloidal silica abrasive. Colloidal silica abrasive suitable for use in the present method for chemical mechanical polishing contain at least one of fumed silica, precipitated silica and agglomerated silica.

The abrasive in the chemical mechanical polishing composition used in the chemical mechanical polishing method of the present invention preferably has an average particle size of $\leq 100$ nm; more preferably 1 to 100 nm. In some embodiments of the present invention, the abrasive is a colloidal silica abrasive and has an average particle size of $\leq 100$ nm, preferably 1 to 100 nm, more preferably 10 to 40 nm, still more preferably 10 to 30 nm, most preferably 20 to 30 nm.

The abrasive in the chemical mechanical polishing composition used in the chemical mechanical polishing method of the present invention preferably contains 0.1 to 30 wt %, more preferably 0.1 to 20 wt %, still more preferably 1 to 20 wt %, yet still more preferably 1 to 10 wt %, most preferably 1 to 5 wt % abrasive.

Preferably, the chemical mechanical polishing composition used in the method of the present invention comprises a colloidal silica abrasive having an average particle size of 1 to 50 nm. More preferably, the chemical mechanical polishing composition used in the method of the invention comprises 1 to 5 wt % of a colloidal silica abrasive having an average particles size of 1 to 50 nm. Most preferably, the chemical mechanical polishing composition used in the method of the present invention comprises 1 to 5 wt % of a colloidal silica abrasive having an average particle size of 20 to 30 nm.

Preferably, the chemical mechanical polishing composition used in the chemical mechanical polishing method of the present invention comprises 0.005 to 0.5 wt %, more preferably 0.005 to 0.1 wt %, still more preferably 0.02 to 0.06 wt % of a diquaternary cation according to formula (I):

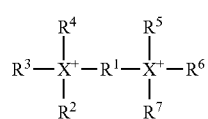

(I)

wherein each X is independently selected from N and P, preferably each X is N; wherein $R^1$ is a saturated or unsaturated, optionally substituted, aryl, alkyl, aralkyl, or alkaryl group having a carbon chain length of 1 to 15 carbon atoms, preferably 2 to 6 carbon atoms; and, wherein $R^2$, $R^3$, $R^4$, $R^5$, $R^6$ and $R^7$ are each independently selected from a saturated or unsaturated, optionally substituted, aryl, alkyl, aralkyl or alkaryl group having a carbon chain length of 1 to 15 carbon atoms, preferably 2 to 6 carbon atoms. Most preferably, the chemical mechanical polishing composition used in the chemical mechanical polishing method of the present invention comprises 0.005 to 0.1 wt %; more preferably 0.02 to 0.06 wt % of a diquaternary cation according to formula (I), wherein each X is N; $R^1$ is a $—(CH_2)_6—$ group; and, wherein $R^2$, $R^3$, $R^4$, $R^5$, $R^6$ and $R^7$ are each a $—(CH_2)_3CH_3$ group. Inclusion of the diquaternary cation according to formula (I) accelerates the silicon dioxide removal rate. Preferably, inclusion of the diquaternary cation also decreases the removal rate of at least one material selected from SiC, SiCN, $Si_3N_4$, SiCO and polysilicon.

The chemical mechanical polishing composition used in the chemical mechanical polishing method of the present invention optionally further comprises 0 to 0.1 wt %, preferably 0.005 to 0.075 wt %, more preferably 0.005 to 0.055 wt % of a quaternary ammonium compound. Preferred quaternary ammonium compounds include tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetratertbutyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof. Most preferred quaternary ammonium compounds include tetraethyl ammonium hydroxide (TEAH), tetramethyl ammonium hydroxide (TMAH) and tetrabutylammonium hydroxide (TBAH).

The water contained in the chemical mechanical polishing composition used in the chemical mechanical polishing method of the present invention is preferably at least one of deionized and distilled to limit incidental impurities.

The chemical mechanical polishing composition used in the chemical mechanical polishing method of the present invention optionally further comprises additional additives selected from dispersants, surfactants, buffers and biocides.

The chemical mechanical polishing composition used in the chemical mechanical polishing method of the present invention optionally is corrosion inhibitor agent free. The term "corrosion inhibitor agent free" as used herein and in the appended claims means that the chemical mechanical polishing composition does not contain benzotriazole; 1,2,3-benzotriazole; 5,6-dimethyl-1,2,3-benzotriazole; 1-(1,2-dicarboxyethyl)benzotriazole; 1-[N,N-bis(hydroxylethyl) aminomethyl]benzotriazole; or 1-(hydroxylmethyl) benzotriazole.

The chemical mechanical polishing composition used in the chemical mechanical polishing method of the present invention is oxidizer free. The term "oxidizer free" as used herein and in the appended claims means that the chemical mechanical polishing composition does not contain oxidizers such as hydrogen peroxide, persulfate salts (e.g., ammonium monopersulfate, and potassium dipersulfate) and periodate salts (e.g., potassium periodate).

The chemical mechanical polishing composition used in the chemical mechanical polishing method of the present invention provides efficacy over a pH of 2 to 6. Preferably, the chemical mechanical polishing composition used provides efficacy over a pH of 3 to 5. Most preferably, the chemical mechanical polishing composition used provides efficacy over a pH of 3 to 4. Acids suitable for use adjusting the pH of the chemical mechanical polishing composition include, for example, phosphoric acid, nitric acid, sulfuric acid and hydrochloric acid. Bases suitable for use adjusting the pH of the chemical mechanical polishing composition include, for example, ammonium hydroxide and potassium hydroxide.

The chemical mechanical polishing composition used with the chemical mechanical polishing method of the present invention exhibits a silicon dioxide removal rate that exceeds its $Si_3N_4$ removal rate under the polishing conditions. Preferably, the chemical mechanical polishing composition used exhibits a silicon dioxide to $Si_3N_4$ removal rate selectivity of $\geq 5:1$ under the polishing conditions. More preferably, the chemical mechanical polishing composition used exhibits a silicon dioxide to $Si_3N_4$ remove rate selectivity of $\geq 6:1$.

Preferably, the chemical mechanical polishing composition used with the chemical mechanical polishing method of the present invention exhibits a silicon dioxide removal rate $\geq 1,500$ Å/min; more preferably 1,800 Å/min; most preferably $\geq 2,000$ Å/min.

Preferably, the chemical mechanical polishing composition used with the chemical mechanical polishing method of the present invention comprises water; 0.1 to 30 wt %, preferably 0.1 to 20 wt %, still more preferably 1 to 20 wt %, yet still more preferably 1 to 10 wt %, most preferably 1 to 5 wt % abrasive having an average particle size of ≦100 nm, preferably 1 to 100 nm, more preferably 10 to 40 nm, still more preferably 10 to 30 nm, most preferably 20 to 30 nm; 0.005 to 0.5 wt %, preferably 0.005 to 0.1 wt %, more preferably 0.02 to 0.06 wt % diquaternary cation according to formula (I):

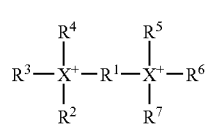

wherein each X is independently selected from N and P, preferably each X is N; wherein $R^1$ is a saturated or unsaturated, optionally substituted, aryl, alkyl, aralkyl, or alkaryl group having a carbon chain length of 1 to 15 carbon atoms, preferably $R^1$ is a $C_2$-$C_6$ alkyl group; and, wherein $R^2$, $R^3$, $R^4$, $R^5$, $R^6$ and $R^7$ are each independently selected from a saturated or unsaturated, optionally substituted, aryl, alkyl, aralkyl or alkaryl group having a carbon chain length of 1 to 15 carbon atoms, preferably $R^2$, $R^3$, $R^4$, $R^5$, $R^6$ and $R^7$ are each independently selected from a $C_2$-$C_6$ alkyl group; and 0 to 0.1 wt %, preferably 0.005 to 0.075 wt %, more preferably 0.005 to 0.055 wt % quaternary alkylammonium compound; wherein the chemical mechanical polishing composition exhibits a silicon dioxide removal rate of ≧1,500 Å/min; preferably 1,800 Å/min; more preferably ≧2,000 Å/min.

The chemical mechanical polishing method of the present invention comprises: providing a substrate, wherein the substrate comprises silicon dioxide; preferably silicon dioxide and at least one of SiC, SiCN, $Si_3N_4$, SiCO and polysilicon; most preferably silicon dioxide deposited on silicon nitride; providing a chemical mechanical polishing composition, wherein the chemical mechanical polishing composition comprises: water, 0.1 to 30 wt %, preferably 0.1 to 20 wt %, still more preferably 1 to 20 wt %, yet still more preferably 1 to 10 wt %, most preferably 1 to 5 wt % abrasive having an average particle size of ≦100 nm, preferably 1 to 100 nm, more preferably 10 to 40 nm, still more preferably 10 to 30 nm, most preferably 20 to 30 nm; 0.005 to 0.5 wt %, preferably 0.005 to 0.1 wt %, more preferably 0.02 to 0.06 wt % diquaternary cation according to formula (I):

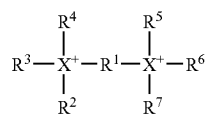

wherein each X is independently selected from N and P, preferably each X is N; wherein $R^1$ is a saturated or unsaturated, optionally substituted, aryl, alkyl, aralkyl, or alkaryl group having a carbon chain length of 1 to 15 carbon atoms, preferably $R^1$ is a $C_2$-$C_6$ alkyl group; and, wherein $R^2$, $R^3$, $R^4$, $R^5$, $R^6$ and $R^7$ are each independently selected from a saturated or unsaturated, optionally substituted, aryl, alkyl, aralkyl or alkaryl group having a carbon chain length of 1 to 15 carbon atoms, preferably $R^2$, $R^3$, $R^4$, $R^5$, $R^6$ and $R^7$ are each independently selected from a $C_2$-$C_6$ alkyl group; and 0 to 0.1 wt %, preferably 0.005 to 0.075 wt %, more preferably 0.005 to 0.055 wt % quaternary alkylammonium compound; providing a chemical mechanical polishing pad; creating dynamic contact at an interface between the chemical mechanical polishing pad and the substrate with a down force of 0.1 to 5 psi, preferably 0.1 to 3 psi; and dispensing the chemical mechanical polishing composition onto the chemical mechanical polishing pad at or near the interface between the chemical mechanical polishing pad and the substrate; wherein the chemical mechanical polishing composition has a pH of 2 to 6, preferably 3 to 5, most preferably 3 to 4; wherein the silicon dioxide and silicon nitride are exposed to the chemical mechanical polishing composition; and, wherein the chemical mechanical polishing composition exhibits a silicon dioxide removal rate of ≧1,500 Å/min, preferably 1,800 Å/min, more preferably ≧2,000 Å/min. Preferably, the chemical mechanical polishing composition used further exhibits a silicon dioxide to silicon nitride selectivity of ≧5:1, more preferably ≧6:1. Preferably, the abrasive used in the chemical mechanical polishing composition is colloidal silica and the chemical mechanical polishing composition used exhibits a silicon dioxide removal rate of at least 1,500 Å/min, more preferably at least 1,800 Å/min, most preferably at least 2,000 Å/min with a platen speed of 93 revolutions per minute, a carrier speed of 87 revolutions per minute, a chemical mechanical polishing composition flow rate of 200 ml/min, and a nominal down force of 3 psi on a 200 mm polishing machine (e.g., a Strasbaugh Model 6EC polisher) where the chemical mechanical polishing pad comprises a polyurethane polishing layer containing polymeric hollow core microparticles and a polyurethane impregnated non-woven subpad (e.g., an IC1010 A2 polishing pad available from Rohm and Haas Electronic Materials CMP Inc.).

Preferably, the chemical mechanical polishing method of the present invention comprises: providing a substrate, wherein the substrate comprises silicon dioxide and silicon nitride, preferably silicon dioxide deposited on silicon nitride; providing a chemical mechanical polishing composition, comprising: water, 1 to 5 wt % colloidal silica abrasive having an average particle size of 20 to 30 nm, 0.02 to 0.06 wt % diquaternary cation according to formula (I):

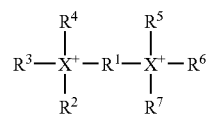

wherein each X is a N; wherein $R^1$ is selected from $C_4$-$C_{10}$ alkyl group; and, wherein $R^2$, $R^3$, $R^4$, $R^5$, $R^6$ and $R^7$ are individually selected from $C_2$-$C_6$ alkyl group; and 0 to 0.1 wt %, preferably 0.005 to 0.075 wt %, more preferably 0.005 to 0.055 wt % quaternary alkylammonium compound; providing a chemical mechanical polishing pad; creating dynamic contact at an interface between the chemical mechanical polishing pad and the substrate with a down force of 0.1 to 5 psi, preferably 0.1 to 3 psi; and dispensing the chemical mechanical polishing composition onto the chemical mechanical polishing pad at or near the interface between the chemical mechanical polishing pad and the substrate; wherein the chemical mechanical polishing composition has a pH of 2 to 6, preferably 3 to 5, most preferably 3 to 4; wherein the silicon dioxide and silicon nitride are exposed to the chemical mechanical polishing composition; and, wherein the chemical mechanical polishing composition exhibits a silicon dioxide to silicon nitride selectivity of ≧5:1, preferably ≧6:1. Preferably, the abrasive used in the chemical mechanical polishing composition used in the chemical mechanical polishing method of the present invention is colloidal silica and the chemical mechanical polishing composition used exhibits a silicon dioxide removal rate of at least 1,500 Å/min, more preferably at least 1,800 Å/min, most preferably 2,000 Å/min with a platen speed of 93 revolutions per minute, a carrier speed of 87 revolutions per minute, a chemical mechanical polishing composition flow rate of 200 ml/min, and a nominal down force of 3 psi on a 200 mm polishing machine (e.g., a Strasbaugh Model 6EC polisher) where the chemical mechanical polishing pad comprises a polyurethane polishing layer containing polymeric hollow core microparticles and a polyurethane impregnated non-woven subpad (e.g., an IC1010 A2 polishing pad available from Rohm and Haas Electronic Materials CMP Inc.)

Preferably, the chemical mechanical polishing method of the present invention comprises: providing a substrate, wherein the substrate comprises silicon dioxide and silicon nitride, preferably silicon dioxide deposited on silicon nitride; providing a chemical mechanical polishing composition, wherein the chemical mechanical polishing composition comprises: water, 1 to 5 wt % colloidal silica abrasive having an average particle size of 20 to 30 nm, 0.02 to 0.06 wt % diquaternary cation according to formula (I):

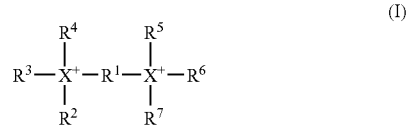

wherein each X is N; wherein $R^1$ is a —$(CH_2)_6$— group; and, wherein $R^2$, $R^3$, $R^4$, $R^5$, $R^6$ and $R^7$ are each a —$(CH_2)_3CH_3$ group; and 0.005 to 0.055 wt % quaternary alkylammonium compound selected from tetraethyl ammonium hydroxide and tetrabutyl ammonium hydroxide; providing a chemical mechanical polishing pad; creating dynamic contact at an interface between the chemical mechanical polishing pad and the substrate with a down force of 0.1 to 3 psi; and dispensing the chemical mechanical polishing composition onto the chemical mechanical polishing pad at or near the interface between the chemical mechanical polishing pad and the substrate; wherein the chemical mechanical polishing composition has a pH of 3 to 4; wherein the silicon dioxide and silicon nitride are exposed to the chemical mechanical polishing composition; and, wherein the chemical mechanical polishing composition exhibits a silicon dioxide to silicon nitride selectivity of ≧5:1, preferably ≧6:1. Preferably, the abrasive used in the chemical mechanical polishing composition used in the chemical mechanical polishing method of the present invention is colloidal silica and the chemical mechanical polishing composition used exhibits a silicon dioxide removal rate of at least 1,500 Å/min, more preferably at least 1,800 Å/min, most preferably at least 2,000 Å/min with a platen speed of 93 revolutions per minute, a carrier speed of 87 revolutions per minute, a chemical mechanical polishing composition flow rate of 200 ml/min, and a nominal down force of 3 psi on a 200 mm polishing machine (e.g., a Strasbaugh Model 6EC polisher) where the chemical mechanical polishing pad comprises a polyurethane polishing layer containing polymeric hollow core microparticles and a polyurethane impregnated non-woven subpad (e.g., an IC1010 A2 polishing pad available from Rohm and Haas Electronic Materials CMP Inc.)

Some embodiments of the present invention will now be described in detail in the following Examples.

Comparative Examples C1-C4 and Examples A1-A20

Chemical Mechanical Polishing Composition Preparation

The chemical mechanical polishing compositions used in the polishing Examples PC1-PC4 and PA1-PA20 (namely chemical mechanical polishing compositions C1-C4 and A1-A20, respectively) were prepared by combining the components in the amounts listed in Table 1 and adjusting the pH of the compositions to the final pH listed in Table 1 with phosphoric acid or nitric acid as noted.

TABLE 1

| Ex # | Abrasive* (wt %) | HMB (wt %) | HBHMAH (wt %) | TBAH (wt %) | TEAH (wt %) | $H_3PO_4$ $HNO_3$ | pH |
|---|---|---|---|---|---|---|---|
| C1 | 4 | — | — | — | — | $HNO_3$ | 4 |
| C2 | 4 | — | — | 0.085 | — | $H_3PO_4$ | 2.6 |
| C3 | 4 | — | — | 0.085 | — | $H_3PO_4$ | 3 |
| C4 | 4 | — | — | 0.085 | — | $HNO_3$ | 3.4 |
| A1 | 4 | — | 0.015 | — | — | $H_3PO_4$ | 4 |
| A2 | 4 | — | 0.025 | — | — | $H_3PO_4$ | 4 |
| A3 | 4 | — | 0.035 | — | — | $H_3PO_4$ | 4 |
| A4 | 4 | — | 0.050 | — | — | $H_3PO_4$ | 4 |
| A5 | 4 | — | 0.025 | — | — | $HNO_3$ | 3.5 |
| A6 | 4 | 0.033 | — | — | — | $H_3PO_4$ | 4 |
| A7 | 4 | 0.033 | — | — | — | $HNO_3$ | 4 |
| A8 | 4 | 0.066 | — | — | — | $H_3PO_4$ | 4 |
| A9 | 4 | 0.033 | — | — | — | $H_3PO_4$ | 3.5 |
| A10 | 4 | — | 0.01 | — | — | $HNO_3$ | 4 |
| A11 | 4 | — | 0.025 | — | — | $HNO_3$ | 4 |
| A12 | 4 | — | 0.050 | — | — | $HNO_3$ | 4 |
| A13 | 4 | — | 0.010 | — | — | $HNO_3$ | 3.4 |
| A14 | 4 | — | 0.025 | — | — | $HNO_3$ | 3.4 |
| A15 | 4 | — | 0.050 | — | — | $HNO_3$ | 3.4 |
| A16 | 4 | — | 0.025 | 0.025 | — | $HNO_3$ | 3.6 |
| A17 | 4 | — | 0.025 | 0.050 | — | $HNO_3$ | 3.6 |
| A18 | 4 | — | 0.025 | — | 0.025 | $HNO_3$ | 3.6 |
| A19 | 4 | — | 0.035 | 0.035 | — | $HNO_3$ | 3.6 |
| A20 | 6 | — | 0.035 | 0.035 | — | $HNO_3$ | 3.6 |

Abrasive: Klebosol ™ PL1598-B25 slurry manufactured by AZ Electronic Materials

HMB: hexamethonium bromide from Sigma-Aldrich Co. (Sigma grade):

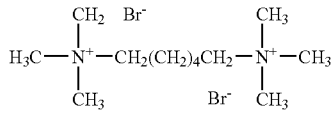

HBHMAH: hexabutylhexamethylenediammonium dihydroxide from Sigma-Aldrich Co. (Purum grade):

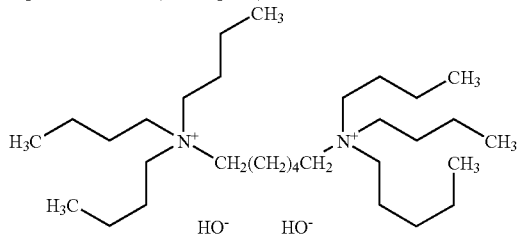

TABLE 1-continued

| Ex # | Abrasive* (wt %) | HMB (wt %) | HBHMAH (wt %) | TBAH (wt %) | TEAH (wt %) | $H_3PO_4$ $HNO_3$ | pH |
|---|---|---|---|---|---|---|---|

TBAH: tetrabutylammonium hydroxide from Sachem, Inc.:

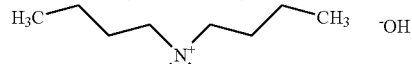

TEAH: tetraethylammonium hydroxide from Sachem, Inc.:

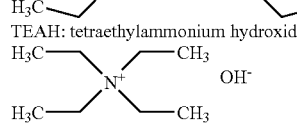

Comparative PC2-PC3 and Examples PA1-PA9 and PA16-PA20

Chemical Mechanical Polishing Experiments

Silicon dioxide removal rate polishing tests were performed using the chemical mechanical polishing compositions prepared according to Comparative Examples C2-C3 and Examples A1-A9 and Examples A16-A20. Specifically, the silicon dioxide removal rate for each of the chemical mechanical polishing compositions C2-C3, A1-A9 and A16-A20 identified in Table 1. These silicon dioxide removal rate experiments were performed on eight inch blanket wafers having a silicon dioxide film on a silicon substrate using a Strasbaugh Model 6EC polisher and an IC1010™ polyurethane polishing pad (commercially available from Rohm and Haas Electronic Materials CMP Inc.) with a down force of 20.7 kPa, a chemical mechanical polishing composition flow rate of 200 ml/min, a table rotation speed of 93 rpm and a carrier rotation speed of 87 rpm. The silicon dioxide removal rates were determined by measuring the film thickness before and after polishing using a Jordan Valley JVX-5200T metrology tool. The results of the silicon dioxide removal rate experiments are provided in Table 2.

TABLE 2

| Polish Example # | Polishing Composition | $SiO_2$ removal rate (Å/min) |
|---|---|---|
| PC2 | C2 | 1560 |
| PC3 | C3 | 1864 |
| PA1 | A1 | 1167 |
| PA2 | A2 | 2045 |
| PA3 | A3 | 1972 |
| PA4 | A4 | 2062 |
| PA5 | A5 | 2120 |
| PA6 | A6 | 1698 |
| PA7 | A7 | 1688 |
| PA8 | A8 | 1355 |
| PA9 | A9 | 798 |
| PA16 | A16 | 2114 |
| PA17 | A17 | 2279 |
| PA18 | A18 | 2275 |
| PA19 | A19 | 2293 |
| PA20 | A20 | 2452 |

Comparative PC1 and Examples PA10, PA12-13 and PA15

Chemical Mechanical Polishing Experiments

Silicon dioxide removal rate polishing tests were performed using the chemical mechanical polishing compositions prepared according to Comparative Example C1 and Examples A10, A12-13 and A15. Specifically, the silicon dioxide removal rate for each of the chemical mechanical polishing compositions C1, A10, A12-A13 and A15 identified in Table 1. These silicon dioxide removal rate experiments were performed on eight inch blanket wafers having a silicon dioxide film on a silicon substrate using an Applied Materials, Inc. Mirra 200 mm polisher and an IC1010™ polyurethane polishing pad (commercially available from Rohm and Haas Electronic Materials CMP Inc.) with a down force of 20.7 kPa, a chemical mechanical polishing composition flow rate of 200 ml/min, a table rotation speed of 93 rpm and a carrier rotation speed of 87 rpm. The silicon dioxide removal rates were determined by measuring the film thickness before and after polishing using a Jordan Valley JVX-5200T metrology tool. The results of the silicon dioxide removal rate experiments are provided in Table 3.

TABLE 3

| Polish Example # | Polishing Composition | $SiO_2$ removal rate (Å/min) |
|---|---|---|
| PC1 | C1 | 112 |
| PA10 | A10 | 1414 |
| PA12 | A12 | 2107 |
| PA13 | A13 | 1778 |
| PA15 | A15 | 2121 |

Comparative SC4 and Examples SA11 & SA14

Chemical Mechanical Polishing Experiments

Silicon dioxide to silicon nitride selectivity polishing tests were performed using the chemical mechanical polishing compositions prepared according to Comparative Example C4 and Examples A11 and A14. Specifically, the silicon dioxide removal rate and the silicon nitride removal rate were measured were measured for each of the chemical mechanical polishing compositions C4, A 11 and A14 identified in Table 1.

The silicon dioxide removal rate experiments were performed on eight inch blanket wafers having a silicon dioxide film on a silicon substrate using an Applied Materials, Inc. Mirra 200 mm polisher and an IC1010™ polyurethane polishing pad (commercially available from Rohm and Haas Electronic Materials CMP Inc.) with a down force of 20.7 kPa, a chemical mechanical polishing composition flow rate of 200 ml/min, a table rotation speed of 93 rpm and a carrier rotation speed of 87 rpm. The silicon dioxide removal rates were determined by measuring the film thickness before and after polishing using a Jordan Valley JVX-5200T metrology tool. The results of the silicon dioxide removal rate experiments are provided in Table 4.

The silicon nitride removal rate experiments were performed on eight inch blanket wafers having a $Si_3N_4$ film on a silicon substrate using an Applied Materials, Inc. Mirra polisher and an IC1010™ polyurethane polishing pad under the same polishing conditions noted above for the silicon dioxide film wafers. The $Si_3N_4$ removal rates were determined by measuring the film thickness before and after polishing using a Jordan Valley JVX-5200T metrology tool. The results of the $Si_3N_4$ removal rate experiments are provided in Table 4.

The silicon dioxide to silicon nitride selectivity (i.e., silicon dioxide removal rate divided by the silicon nitride removal rate) were calculated for each of the chemical mechanical polishing compositions C4, A11 and A14 identified in Table 1 using the measured silicon dioxide and silicon nitride removal rates. The calculated selectivity are provided in Table 4.

TABLE 4

| Selectivity Example # | Polishing Composition | $SiO_2$ removal rate (Å/min) | $Si_3N_4$ removal rate (Å/min) | $SiO_2$ to $Si_3N_4$ selectivity |
|---|---|---|---|---|
| SC4 | C4 | 1893 | 373 | 5.1 |
| SA11 | A11 | 1994 | 234 | 8.5 |
| SA14 | A14 | 2071 | 319 | 6.6 |

We claim:

1. A method for chemical mechanical polishing of a substrate, comprising:
providing a substrate, wherein the substrate comprises silicon dioxide;
providing a chemical mechanical polishing composition, wherein the chemical mechanical polishing composition comprises: water, 0.1 to 30 wt % abrasive having an average particle size of ≦100 nm; 0.005 to 0.5 wt % diquaternary cation according to formula (I):

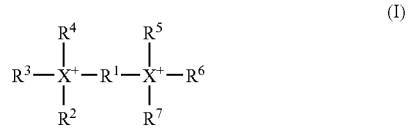

wherein each X is independently selected from N and P;
wherein $R^1$ is a $C_2$-$C_6$ alkyl group; and,
wherein $R^2$, $R^3$, $R^4$, $R^5$, $R^6$ and $R^7$ are each independently selected from a $C_2$-$C_6$ alkyl group; and
0 to 0.1 wt % quaternary alkylammonium compound;
providing a chemical mechanical polishing pad;
creating dynamic contact at an interface between the chemical mechanical polishing pad and the substrate with a down force of 0.1 to 5 psi; and
dispensing the chemical mechanical polishing composition onto the chemical mechanical polishing pad at or near the interface between the chemical mechanical polishing pad and the substrate;
wherein the chemical mechanical polishing composition has a pH of 2 to 6; and, wherein the chemical mechanical polishing composition exhibits a silicon dioxide removal rate of at least 1,500 Å/min.

2. The method of claim 1, wherein the chemical mechanical polishing composition is corrosion inhibitor free.

3. The method of claim 1, wherein the abrasive is a colloidal silica; and wherein the chemical mechanical polishing composition exhibits a silicon dioxide removal rate of at least 1,500 Å/min with a platen speed of 93 revolutions per minute, a carrier speed of 87 revolutions per minute, a chemical mechanical polishing composition flow rate of 200 ml/min, and a nominal down force of 3 psi on a 200 mm polishing machine where the chemical mechanical polishing pad comprises a polyurethane polishing layer containing polymeric hollow core microparticles and a polyurethane impregnated non-woven subpad.

4. The method of claim 1, wherein the substrate further comprises at least one of SiC, SiCN, $Si_3N_4$, SiCO and polysilicon.

5. The method of claim 1, wherein the substrate further comprises $Si_3N_4$; wherein the abrasive is a colloidal silica; wherein the chemical mechanical polishing composition exhibits a silicon dioxide removal rate of at least 1,500 Å/min with a platen speed of 93 revolutions per minute, a carrier speed of 87 revolutions per minute, a chemical mechanical polishing composition flow rate of 200 ml/min, and a nominal down force of 3 psi on a 200 mm polishing machine where the chemical mechanical polishing pad comprises a polyurethane polishing layer containing polymeric hollow core microparticles and a polyurethane impregnated non-woven subpad.

6. The method of claim 1, wherein the substrate provided comprises silicon dioxide deposited on silicon nitride; wherein the chemical mechanical polishing composition provided comprises water; 1 to 5 wt % colloidal silica abrasive having an average particle size of 20 to 30 nm; 0.02 to 0.06 wt % diquaternary cation according to formula (I) and 0.005 to 0.055 wt % quaternary alkylammonium compound selected from tetraethyl ammonium hydroxide and tetrabutyl ammonium hydroxide; wherein the down force applied is 0.1 to 3 psi; wherein the chemical mechanical polishing composition provided has a pH of 3 to 4; wherein the silicon dioxide and silicon nitride are exposed to the chemical mechanical polishing composition; and, wherein the chemical mechanical polishing composition exhibits a silicon dioxide to silicon nitride selectivity of at least 5 to 1.

7. The method of claim 6, wherein the chemical mechanical polishing composition exhibits a silicon dioxide removal rate of at least 1,500 Å/min with a platen speed of 93 revolutions per minute, a carrier speed of 87 revolutions per minute, a chemical mechanical polishing composition flow rate of 200 ml/min, and a nominal down force of 3 psi on a 200 mm polishing machine where the chemical mechanical polishing pad comprises a polyurethane polishing layer containing polymeric hollow core microparticles and a polyurethane impregnated non-woven subpad.

8. A method for chemical mechanical polishing of a substrate, comprising:
providing a substrate, wherein the substrate comprises silicon dioxide;
providing a chemical mechanical polishing composition, wherein the chemical mechanical polishing composition comprises: water, 0.1 to 30 wt % abrasive having an average particle size of ≦100 nm; 0.005 to 0.5 wt % diquaternary cation according to formula (I):

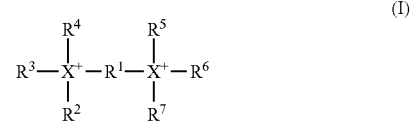

wherein each X is a N;
wherein $R^1$ is a $C_2$-$C_6$ alkyl group; and,
wherein $R^2$, $R^3$, $R^4$, $R^5$, $R^6$ and $R^7$ are each independently selected from a $C_2$-$C_6$ alkyl group; and
0 to 0.1 wt % quaternary alkylammonium compound;
providing a chemical mechanical polishing pad;
creating dynamic contact at an interface between the chemical mechanical polishing pad and the substrate with a down force of 0.1 to 5 psi; and
dispensing the chemical mechanical polishing composition onto the chemical mechanical polishing pad at or near the interface between the chemical mechanical polishing pad and the substrate;
wherein the chemical mechanical polishing composition has a pH of 2 to 6; and, wherein the chemical mechanical polishing composition exhibits a silicon dioxide removal rate of at least 1,500 Å/min.

9. The method of claim 8, wherein the chemical mechanical polishing composition is corrosion inhibitor free.

10. The method of claim 8, wherein the abrasive is a colloidal silica; and wherein the chemical mechanical polishing composition exhibits a silicon dioxide removal rate of at least 1,500 Å/min with a platen speed of 93 revolutions per minute, a carrier speed of 87 revolutions per minute, a chemical mechanical polishing composition flow rate of 200 ml/min, and a nominal down force of 3 psi on a 200 mm polishing machine where the chemical mechanical polishing pad comprises a polyurethane polishing layer containing polymeric hollow core microparticles and a polyurethane impregnated non-woven subpad.

11. The method of claim 8, wherein the substrate further comprises at least one of SiC, SiCN, $Si_3N_4$, SiCO and polysilicon.

12. The method of claim 8, wherein the substrate further comprises $Si_3N_4$; wherein the abrasive is a colloidal silica; wherein the chemical mechanical polishing composition exhibits a silicon dioxide removal rate of at least 1,500 Å/min with a platen speed of 93 revolutions per minute, a carrier speed of 87 revolutions per minute, a chemical mechanical polishing composition flow rate of 200 ml/min, and a nominal down force of 3 psi on a 200 mm polishing machine where the chemical mechanical polishing pad comprises a polyurethane polishing layer containing polymeric hollow core microparticles and a polyurethane impregnated non-woven subpad.

13. The method of claim 8, wherein the substrate provided comprises silicon dioxide deposited on silicon nitride; wherein the chemical mechanical polishing composition provided comprises water; 1 to 5 wt % colloidal silica abrasive having an average particle size of 20 to 30 nm; 0.02 to 0.06 wt % diquaternary cation according to formula (I) and 0.005 to 0.055 wt % quaternary alkylammonium compound selected from tetraethyl ammonium hydroxide and tetrabutyl ammonium hydroxide; wherein the down force applied is 0.1 to 3 psi; wherein the chemical mechanical polishing composition provided has a pH of 3 to 4; wherein the silicon dioxide and silicon nitride are exposed to the chemical mechanical polishing composition; and, wherein the chemical mechanical polishing composition exhibits a silicon dioxide to silicon nitride selectivity of at least 5 to 1.

14. The method of claim 13, wherein the chemical mechanical polishing composition exhibits a silicon dioxide removal rate of at least 1,500 Å/min with a platen speed of 93 revolutions per minute, a carrier speed of 87 revolutions per minute, a chemical mechanical polishing composition flow rate of 200 ml/min, and a nominal down force of 3 psi on a 200 mm polishing machine where the chemical mechanical polishing pad comprises a polyurethane polishing layer containing polymeric hollow core microparticles and a polyurethane impregnated non-woven subpad.

* * * * *